United States Patent [19]
Holt

[11] Patent Number: 5,608,334
[45] Date of Patent: Mar. 4, 1997

[54] DEVICE TESTING SYSTEM WITH CABLE PIVOT AND METHOD OF INSTALLATION

[75] Inventor: Alyn R. Holt, Cherry Hill, N.J.

[73] Assignee: InTest Corporation, Cheery Hill, N.J.

[21] Appl. No.: 425,921

[22] Filed: Apr. 20, 1995

[51] Int. Cl.$^6$ .............................. G01R 31/02; B66F 9/18
[52] U.S. Cl. .............. 324/758; 414/590; 901/48
[58] Field of Search ................. 324/158.1, 758, 324/754; 414/590, 673; 901/48

[56] References Cited

U.S. PATENT DOCUMENTS

| | | | |
|---|---|---|---|
| 3,128,887 | 4/1964 | Le Guennec et al. | 901/21 |
| 4,160,207 | 7/1979 | Haines | 324/754 |
| 4,517,512 | 5/1985 | Petrich et al. | 324/754 |
| 4,527,942 | 7/1985 | Smith | 414/590 |
| 4,588,346 | 5/1986 | Smith | 324/758 |
| 4,589,815 | 5/1986 | Smith | 324/758 |
| 4,650,391 | 3/1987 | Adon et al. | 414/222 |
| 4,665,360 | 5/1987 | Phillips | 324/754 |
| 4,705,447 | 11/1987 | Smith | 414/590 |
| 4,857,838 | 8/1989 | Willberg | 324/758 |
| 4,893,074 | 1/1990 | Holt et al. | 324/758 |
| 5,030,869 | 7/1991 | Holt et al. | 324/758 |
| 5,241,870 | 9/1993 | Holt | 73/866.5 |

OTHER PUBLICATIONS

"The inTest Handbook"; In Test Corporation, 12 Springdale Rd., Cherry Hill, N.J. 08003; 1992 (month not available).
"in2 Test Head Positioner" Sales Brochure, Apr. 28, 1989.

*Primary Examiner*—Ernest F. Karlsen
*Attorney, Agent, or Firm*—Ratner & Prestia

[57] ABSTRACT

A device testing system of the type in which an electronic test head is mounted for pivotal movement about three orthogonal axes. Cables are connected between a test cabinet and the test head to carry electronic signals. The test head is directly mounted to, and the cable is introduced to the test head through, a single piece cable pivot. The single piece cable pivot is attached to its housing by a method of installation which includes attaching cam followers to the housing through an opening included in the ring.

15 Claims, 6 Drawing Sheets

5,608,334

DEVICE TESTING SYSTEM WITH CABLE PIVOT AND METHOD OF INSTALLATION

BACKGROUND OF INVENTION

A. Field of Invention

The present invention relates, in general, to a system for testing electronic devices in which an electronic test head is positioned to connect to and dock with a handler of the device to be tested. More specifically, this invention relates to a pivot (and a method of installation) by which cable can be attached to and move with a movable test head.

B. Description of Related Art

In the automatic testing of integrated circuits and other electronic devices, special device handlers have been used which place the device to be tested in position. The electronic testing itself is done by a large and expensive automatic testing system which includes a test head which connects to and docks with the device handler. The test head uses high speed electronic timing signals so that the electronic circuits must be located as close as possible to the device under test. Accordingly, the test head is densely packaged with electronic circuits in order to achieve the high speed testing of the sophisticated devices.

A positioner, able to move along a support structure, carries the test head to the desired location at which the test head is positioned to connect to and dock with the device handler. The test head is attached to the positioner so that the test head can achieve six degrees of freedom.

A major problem is connecting a heavy cable, extending from a cabinet containing part of the automatic testing system, into the test head. Because the test head can be moved to a desired location and into a desired position, the heavy cable must move with the test head.

Conventional arrangements used to provide synchronized movement between the test head and cable fall generally into two categories: cable pivot-type and tumble-type arrangements.

In the tumble type, the cable is slung beneath the test head so that it connects to the side of the test head opposite the mechanism by which the test head is attached, at its center of gravity, to the positioner. This arrangement avoids the complexity and expense of a cable-pivot type approach. However, for a number of different orientations of the test head, this arrangement allows the cable to hang beneath the test head to beyond the side of the test head. Thus, the cable often gets in the way of the operator of the test system and very large test heads are limited in how low they may be positioned before the cables will touch the floor when the test head is in its down position when the interface plane is perpendicular to the floor. Moreover, the tumble-type arrangement requires a lengthy cable because it extends completely across the bottom of the test head for certain orientations of the test head.

A variety of cable pivot-type arrangements are known. In one, the test head is also held at its center of gravity by the positioner. The cable and positioner are attached to the test head on opposite ends of the test head. One disadvantage of this type of arrangement is that it cannot access, from underneath, horizontal plane handlers which are built like two pedestal office desks; the positioner stands where one pedestal of such a desk would be located.

A second cable pivot-type arrangement involves passing the cable through the mechanism by which the test head is attached to the positioner. This mechanism is arranged to permit pivotal movement of the test head. Typically, such mechanisms include an inner ring which, through bearings, is spaced from and able to rotate in an outer ring. One disadvantage of these mechanisms is that the mechanism is expensive: the bearings themselves and the precise machining necessary to load the bearings in the ring are costly.

With the above discussion in mind, it is one object of the present invention to provide a device testing system which protects the cables which interconnect the test head to the test system. Continual bending, twisting, and insertion/removal of such cables is inherent when the system is used to test a variety of probers and handlers. Accordingly, the fatigue life of the cables is an important concern. Because fatigue life of materials from which cables are made decreases with increasing stress and the applied stress is proportional to the length of cable over which a bend or twist occurs, it is advantageous to control the length of the cable encompassing the bend or twist.

Another object is safety and ease of operation of the test head positioning system. Related objects are to provide a system which properly balances the test head in the cable pivot arrangement for acceptable handling. Still another object is to provide a system able to dock to a variety of probers and handlers, including those built like pedestal desks, and to position especially large test heads low to the floor without having the cables touch the floor. It is also advantageous to allow mounting of the test head directly to the cable pivot arrangement. Finally, an object of the present invention is to provide a system which can be manufactured cost efficiently, especially by eliminating alignment tolerance requirements.

SUMMARY OF THE INVENTION

To achieve these and other objects, and in view of its purposes, the present invention provides a device testing system with a support structure and a positioner able to move along that support structure. Also included is a cable pivot housing defining a substantially circular passage and having a connecting structure on only one side, so that the passage is partly closed on that side and completely open on the opposite side. A single piece test head adapter ring is rotatably positioned in the passage of the housing. The ring is installed in the housing by a method of installation which includes attaching cam followers to the housing through an opening included in the ring. The testing system further includes a test head, attached to the test head adapter ring so that pivotal movement of the test head is permitted; a test cabinet; a cable connected between the test cabinet and the test head and passing through the test head adapter ring; and a cable support.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings, in which.

DETAILED DESCRIPTION OF THE INVENTION

Figure 1A:
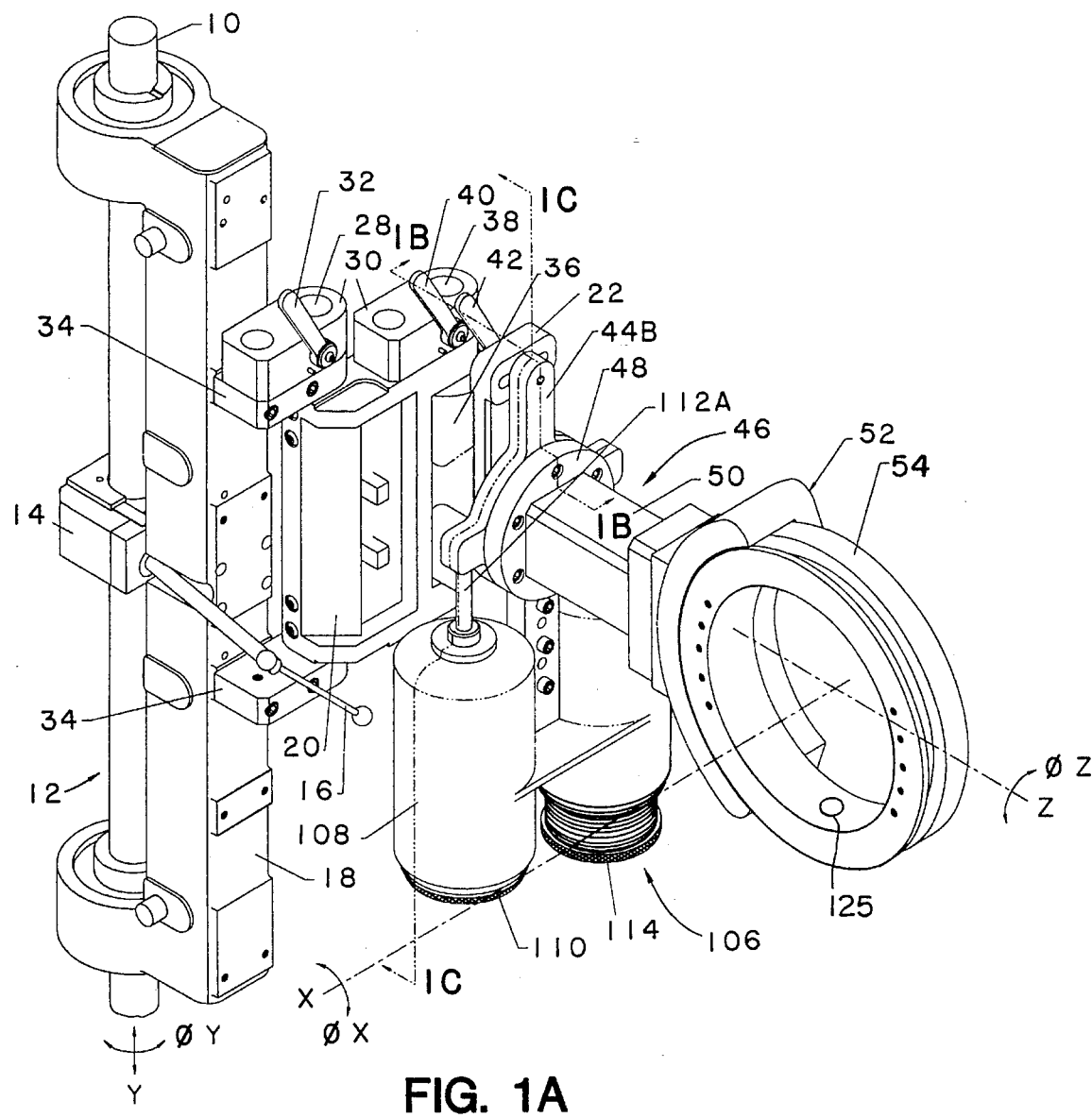
FIG. 1A is a perspective view of the support structure of a device testing system constructed in accordance with the present invention, which also shows the six degrees of freedom of the system.

FIG. 1A is a perspective view of an electronic device testing system constructed in accordance with the present invention. The system is generally similar to the one described and illustrated in U.S. Pat. Nos. 4,893,074 and 4,589,815, the contents of which are incorporated herein by reference.

The system includes a support structure (not shown) which maintains a main shaft 10 in the vertical direction (the y-direction of FIG. 1) and a positioner 12. Positioner 12 can move vertically along shaft 10 in the y-direction and can rotate about shaft 10 in the $\theta_y$ direction. Positioner 12 can be fixed relative to shaft 10 by tightening main lock collar 14 using main lock 16. Positioner 12 includes a main arm 18, a forearm assembly 20, and a wrist assembly 22. Forearm assembly 20 is attached to main arm 18 at forearm mount blocks 34 so that forearm assembly 20 can move vertically along shaft 10 in the y-direction.

Forearm assembly 20 has a vertical elbow shaft 28 displaced in the z-direction from the vertical axis along which main shaft 10 is disposed. Forearm assembly 20 can rotate in the $\theta_y$ direction about shaft 28 relative to main arm 18. Lock collar 30, activated by elbow lock 32, fixes forearm assembly 20 on shaft 28.

Wrist assembly 22, in turn, is attached to forearm assembly 20. Wrist assembly 22 includes a wrist housing 36 having a circular portion, through which a vertical wrist shaft 38 is disposed, and a block face. The circular portion and block face of wrist housing 36 may be formed as a single casting. Vertical wrist shaft 38 is further displaced in the z-direction from elbow shaft 28 and main shaft 10. Note that the combination of possible rotations about the three, separate, vertical shafts 10, 28, and 38 allows the test head 56 (see FIG. 2A) to be positioned along the x and z axes. Wrist assembly 22 can rotate in the $\theta_y$ direction about vertical wrist shaft 38—unless locked in place by vertical wrist lock 40.

Figures 1B, 1C:
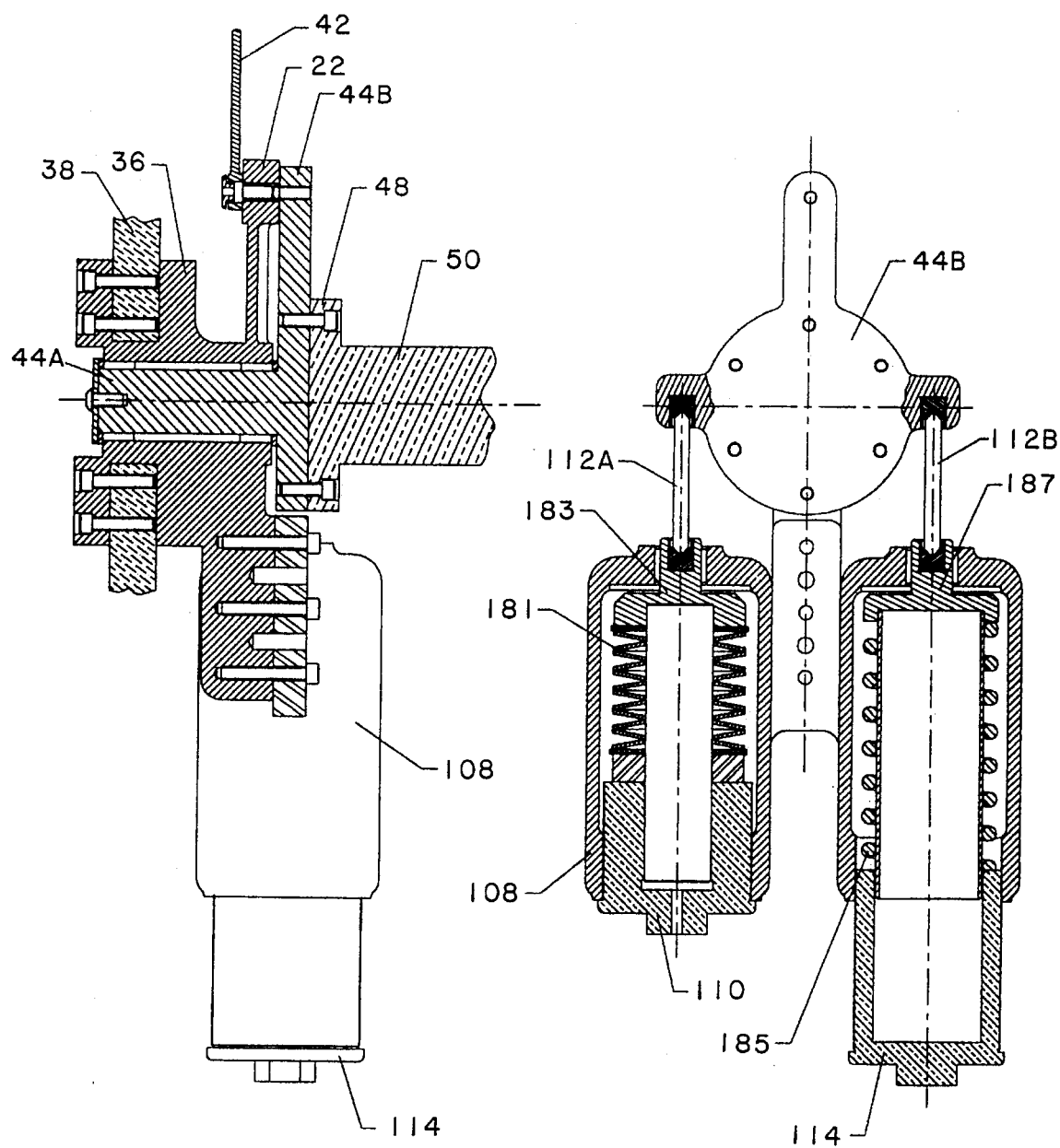
FIGS. 1B and 1C are cross sectional views taken along lines 1B—1B and 1C—1C in FIG. 1A, respectively.

Wrist assembly 22 can also rotate about the z axis. As shown in FIG. 1B, wrist assembly 22 also has a horizontal circular portion through which a horizontal wrist shaft 44A is disposed. Horizontal wrist shaft 44A has a flange portion 44B which is attached to the circular flange end 48 of cable pivot adapter 46. To prevent such rotation, horizontal wrist lock 42 can be used to fix horizontal wrist shaft 44A of wrist assembly 22 in position. Cable pivot adapter 46 is affixed to horizontal wrist shaft 44A by conventional screws, bolts, pins, or the like.

For acceptable handling, it is very important that the cantilever load created by, among other components, the cable and test head 56 (shown in FIG. 2B and described in greater detail below), be balanced in test head adapter ring 54 for $\theta_z$ movement. Without proper balancing, a human operator rotating a 500 kg test head in the $\theta_z$ direction would be handling approximately 1600 Newton-meters of torque. For a human operator to be handling this amount of torque is unsafe.

FIG. 1C shows one way in which balancing is achieved. A spring assembly 106 is attached through spring housing 108 to wrist housing 36. Inside housing 108, two, separate springs are provided to compensate for the cantilever load. On the load side of cable pivot housing 52 (in the positive x-direction), spring housing 108 contains a disc spring 181. Disc spring 181 is guided by disc spring piston 183 and installed by a disc spring screw 110. A gimbal pin 112A connects the disc spring and piston assembly of spring assembly 106 to wrist assembly 22 via horizontal wrist shaft 44A. Opposite the load side of cable pivot housing 52 (in the negative x-direction), spring housing 108 contains coil spring 185. Coil spring 185 is guided by coil spring piston 187 and adjusted by a coil spring screw 114. Gimbal pin 112B connects coil spring 185 and coil spring piston 187 of spring assembly 106 to wrist assembly 22 via horizontal wrist shaft 44A. The coil spring is used for calibration, to compensate for tolerance inherent in disc spring 181.

Cable pivot adapter 46 includes flange 48 and a beam 50. Beam 50 is attached (welded or formed as an integral casting, for example) to flange 48 on one end. Cable pivot adapter 46 is affixed to horizontal wrist shaft 44A by conventional screws, bolts, pins, or the like which extend through openings in flange 48 to be received in respective corresponding openings in flange portion 44B. Beam 50 is attached (through screws, bolts, or the like) to a cable pivot housing 52 on its opposite end, thereby connecting flange 48 and cable pivot housing 52. Cable pivot housing 52 retains test head adapter ring 54, allowing ring 54 to rotate (in the $\theta_x$ direction) within housing 52 in a manner described below. Test head 56 is attached to ring 54 in a number of possible ways, some of which are described below, allowing ring 54 to transfer movement to test head 56.

Test head 56 interacts with the electronic interface components (connectors, pogo pins, printed circuit boards, and the like) of the system to be tested (not shown). In order to protect the fragile electronic interface components from damage or excessive wear during the docking and undocking action between test head 56 and the system, motion of the test head during such action must be precisely in line with the motion axis of the electronic interface components. Accordingly, test head 56 must be able to move accurately and effortlessly in any or all of the six degrees of motion freedom of a Cartesian coordinate system during the docking and undocking action. These six degrees of freedom, as shown in FIG. 1, include linear motion in the x (horizontal; left to right), y (vertical), and z (horizontal; in and out) axes and rotation about each axis in the $\theta_x$, $\theta_y$, and $\theta_z$ directions—all relative to the center of the interface board plane on which the electrical interconnect components are mounted.

The invention achieves six degrees of freedom of motion by carefully assuring that balance is maintained (as described below) on each axis of motion in the design of both the positioner 12 and the test head adapter ring 54 elements of the device testing system.

A cable, usually composed of a number of individual cables (not shown), extends into test head 56 through test head adapter ring 54. Electronic signals generated by test head 56 and power are delivered along these cables to and from a test cabinet (not shown). To carry the cables, a telescopic cable support 58 is provided. Support 58 has spherical bearings on each end which allow freedom of movement. Support 58 is more fully described in U.S. Pat. No. 4,893,074 which is incorporated herein by reference.

Figure 2A:
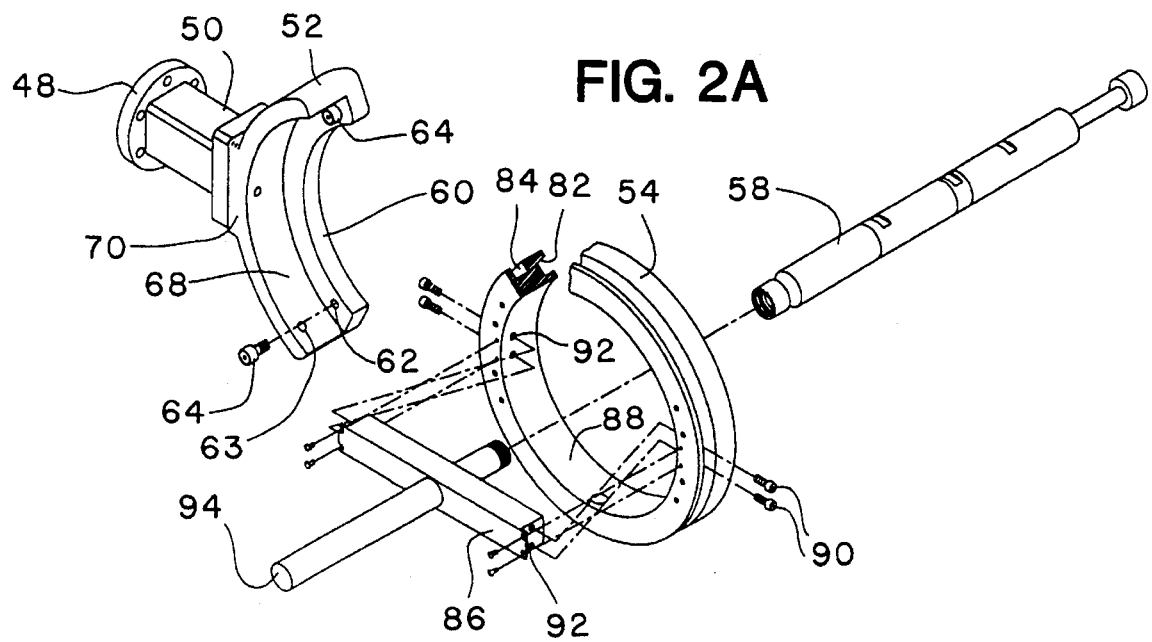
FIG. 2A is an exploded view of the test head adapter ring support structure according to an exemplary embodiment of the present invention showing one way of attaching a test head to the adapter ring.
Figure 2B:
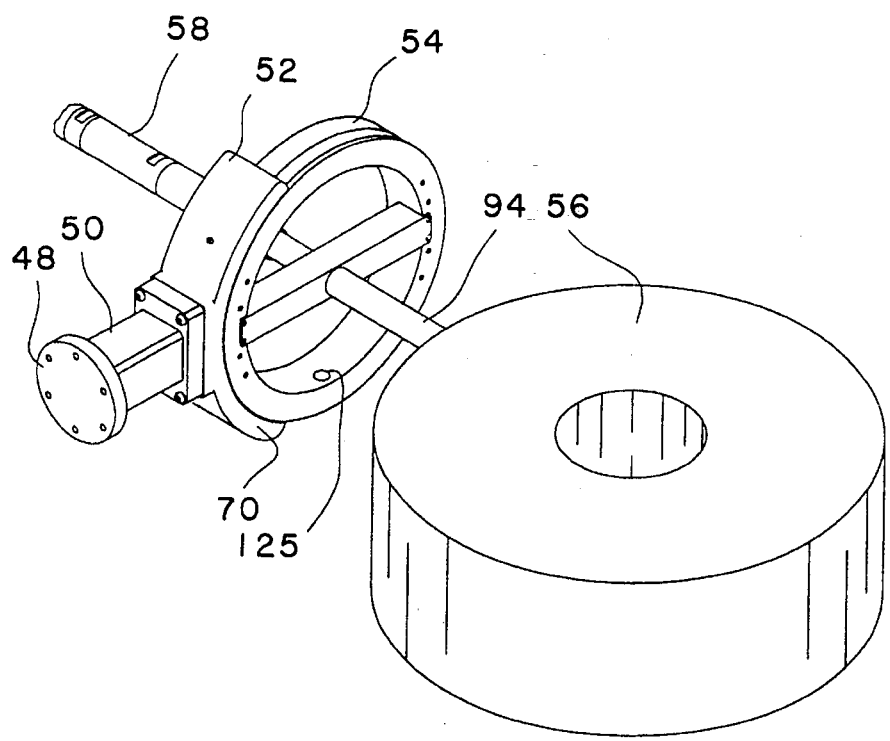
FIG. 2B is a perspective view of the test head adapter ring support structure, according to the exemplary embodiment of the present invention of FIG. 2A showing the test head attached.

As shown in FIGS. 2A and 2B, cable pivot housing 52 only partially surrounds test head adapter ring 54. Housing 52 has a lip 60 having two holes 62 into which two horizontal cam followers 64 are inserted (in the x-direction). Perpendicular to horizontal cam followers 64, three radial cam followers 66 are inserted into the inside radial surface 68 of cable pivot housing 52 into three holes 63. The wall 70 of housing 52 which faces test head 56 is open; wall 70 does not contain a lip or flange similar to lip 60 on the opposite side of housing 52.

Cable pivot housing 52 engages test head adapter ring 54, holding ring 54 in position, allowing ring 54 to rotate within housing 52, and transferring the location-fixing movements of positioner 12 to test head 56. Test head adapter ring 54 is formed as a single piece ring, generally as aluminum plate or tubing. Ring 54 includes guide 82 and groove 84. Steel may also be used. However, steel is typically heavier than aluminum and more expensive.

Guide 82 is formed around the outside of test head adapter ring 54 in the side opposite wall 70. Horizontal cam followers 64 engage guide 82 when ring 54 is in position inside cable pivot housing 52. Similarly, a radial groove 84 is formed around the circumference of ring 54. Groove 84 engages radial cam followers 66 when ring 54 is in position inside housing 52.

Horizontal cam followers 64 and radial cam followers 66 are standard hardware, forming complete units containing needle bearings. Such cam followers are inexpensive relative to the big-diameter ball bearings previously used in conventional cable pivot arrangements, although they are as useful in high-load carrying parts such as test head adapter ring 54.

According to the present invention, two horizontal cam followers 64 and three radial cam followers 66 are preferable. The horizontal cam followers 64 are disposed perpendicular to the radial cam followers 66. Moreover, the two horizontal cam followers 64 and two of the three radial cam followers 66 are linearly disposed along imaginary, intersecting lines, with the third radial cam follower 66 disposed midway between the two horizontal-radial cam follower pairs.

Such an arrangement of the cam followers is advantageous because it minimizes alignment tolerance requirements. In order to shape the cantilever load imposed on test head adapter ring 54, the cam followers must be in line. If three horizontal cam followers 64 were used, for example, they would not only have to be critically perpendicular to the radial cam followers 66, but they would have to be in line so that they properly shared the load. Because only two horizontal cam followers 64 are used, their perpendicularity is not as critical and alignment tolerances are more easily met.

Figure 3A:
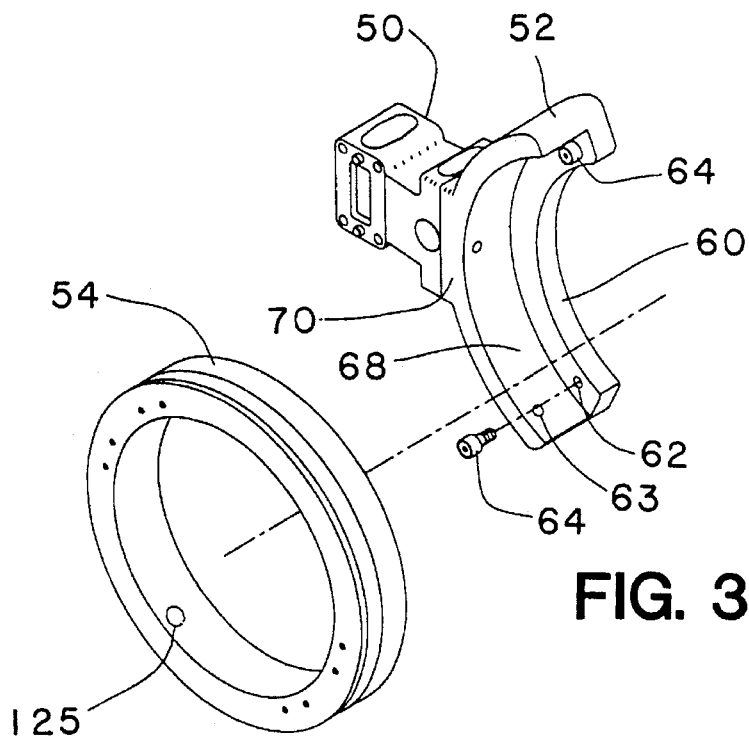
FIGS. 3A–E are perspective drawings illustrating installation of the single piece test head adapter ring to the cable pivot housing.
Figure 3B:
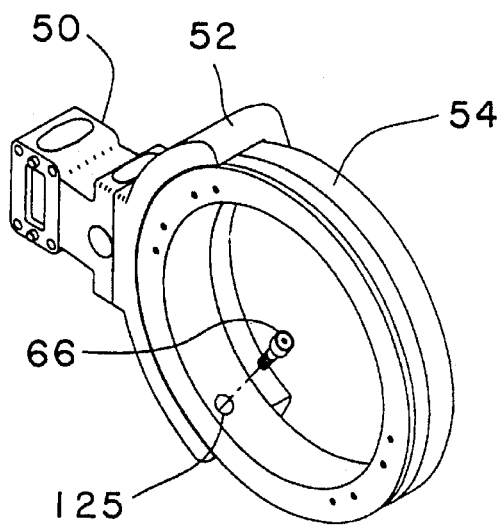
Figure 3C:
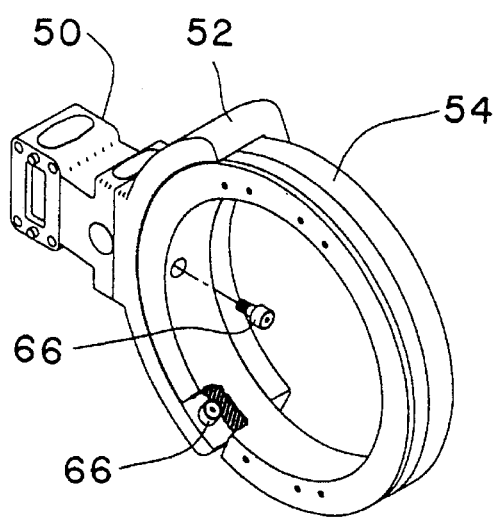
Figure 3D:
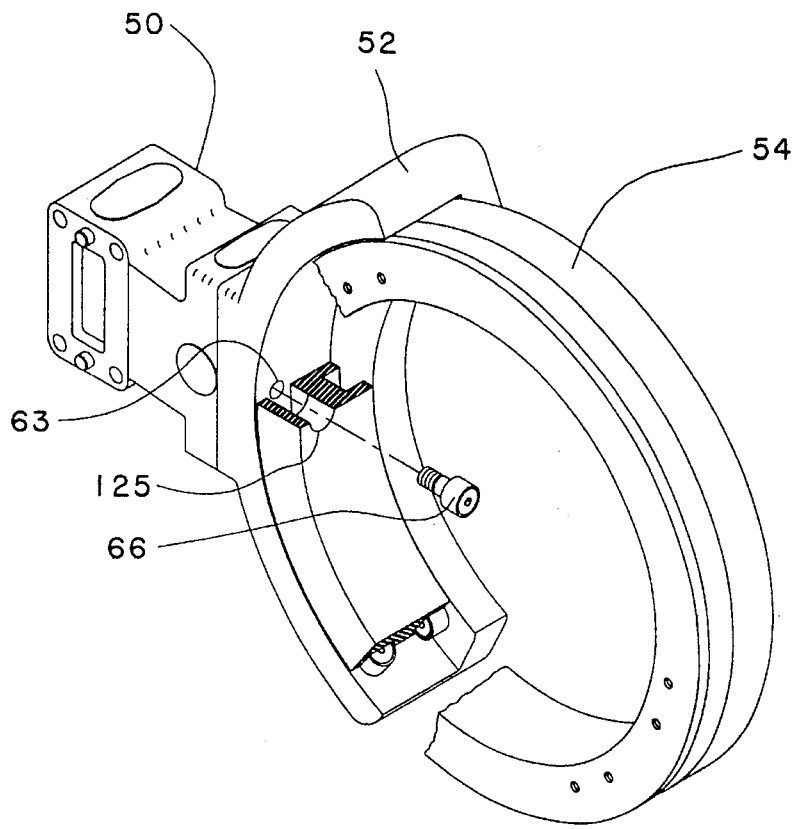
Figure 3E:
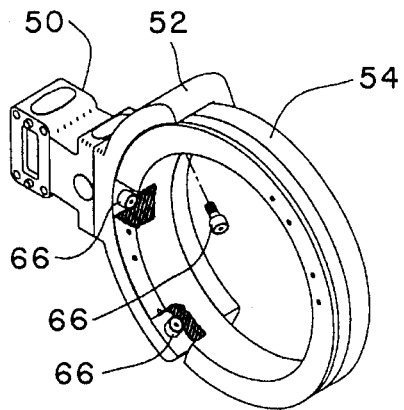

FIGS. 3A–3D illustrate attachment of test head adapter ring 54, to housing 52. First, as shown in FIG. 3A, after cam followers 64 are inserted into holes 62, cam followers 64 are engaged into guide 82. Opening 125 is then used to install cam followers 66. As shown in FIG. 3B, test head adapter ring is rotated so that opening 125 coincides with one of the holes 63. Cam follower 66 is then inserted through hole 125 and into one of the holes 63. Next, ring 54 is rotated, as shown in FIGS. 3C and 3D so that hole 125 coincides with another hole 63. Another cam follower 66 is then inserted in hole 63. As shown in FIG. 3D, ring 54 is again rotated so that hole 125 coincides with the remaining hole 63. Remaining cam follower 66 is then inserted into remaining hole 63. In this manner, ring 54 is attached to housing 52.

Figure 4:
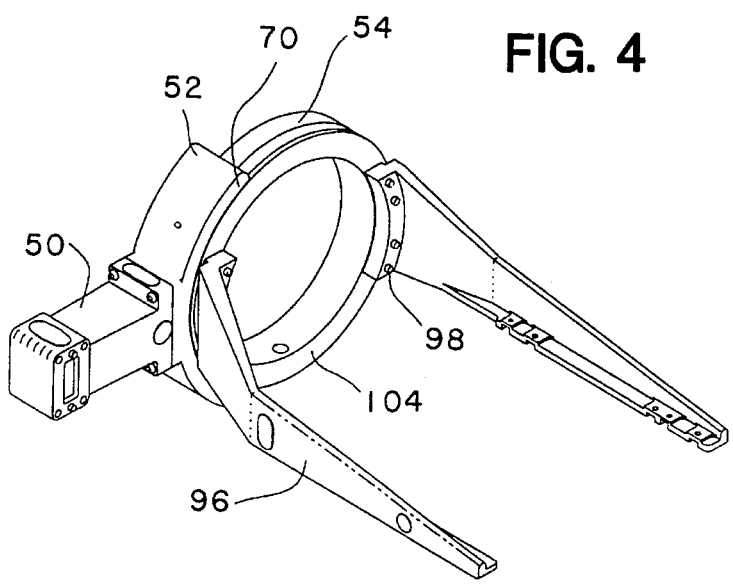
FIG. 4 is a perspective view of the test head adapter ring support structure according to another exemplary embodiment of the present invention showing a further way of attaching a test head to the adapter ring.

Test head 56 may be mounted to test head adapter ring 54 in a variety of ways. Three embodiments of the attachment between the test head 56 and the ring 54 are illustrated in the drawing. Turning again to FIG. 2A and FIG. 2B, a test head mount 86 can be affixed to the inside surface 88 of test head adapter ring 54 or to both the inside surface 88 and the face 104 of ring 54 (or to face 104 as shown in FIG. 4 and as described below). Radial screws, pins, or the like 90 engaging passages 92 in test head mount 86 may be used to position test head mount 86. A rod 94, affixed to test head 56 on one end, is attached to (and may be integral with) test head mount 86. Rod 94 may extend beyond test head mount 86 and attaches to cable support 58 on its opposite end.

FIG. 4 shows an alternative attachment between the test head 56 and the test head adapter ring 54. In that embodiment, a cradle, harness, or yoke 96 supporting test head 56 is attached directly to the face 104 of ring 54 without using additional structure such as test head mount 86 and rod 94. Conventional screws, bolts, pins, or the like 98 may be used to attach the elements.

Figure 5:
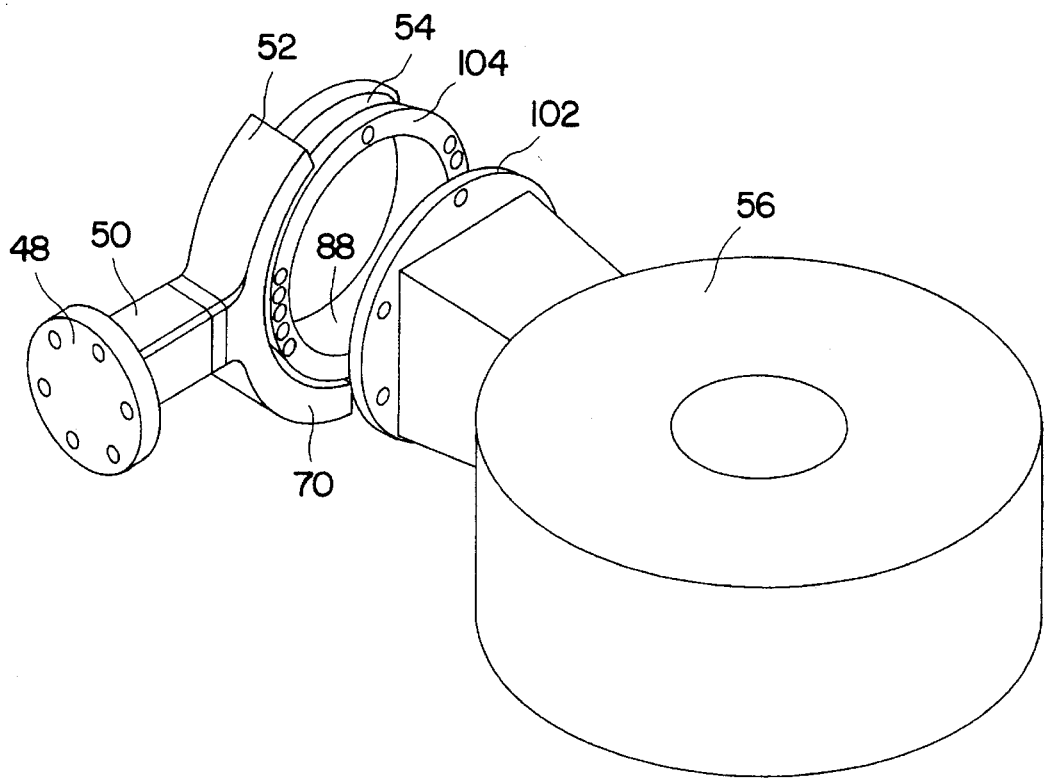
FIG. 5 is a perspective view of the test head adapter ring support structure, and of a third embodiment of the attachment between the test head and the ring, of a device testing system constructed in accordance with the present invention.

FIG. 5 illustrates a third embodiment of the attachment between the test head 56 and the test head adapter ring 54. A projection 102 is formed on test head 56. Projection 102 can be attached, by conventional means, directly to ring 54.

The outside diameter of ring 54 is desirably smaller than the thickness of test head 56 so that ring 54 is below the top surface of the docking plate positioned on top of test head 56. This prevents interference with docking to large handlers.

Given the constraints on the outside diameter of test head adapter ring 54, the inside diameter of ring 54 is reduced as the thickness of face 104 is increased; but that inside diameter must be sufficient to pass the relatively large cable to test head 56. By providing an open cable pivot housing 52, the present invention can incorporate a thinner face 104 yet achieve the consequent mounting advantage.

In any event, the center of gravity of the load of test head 56 (and its associated cables) should pass through the center of ring 54 so that the test head remains balanced as it is rotated about the $\theta_x$ axis. The center of gravity ($C_g$) of the test head load may not be symmetrically aligned if, for example, the cable does not connect to test head 56 symmetrically about the $C_g$ (i.e. the cable may be attached to an edge of test head 56 in certain designs). Such misalignment can exacerbate the balancing difficulty.

Figure 6:
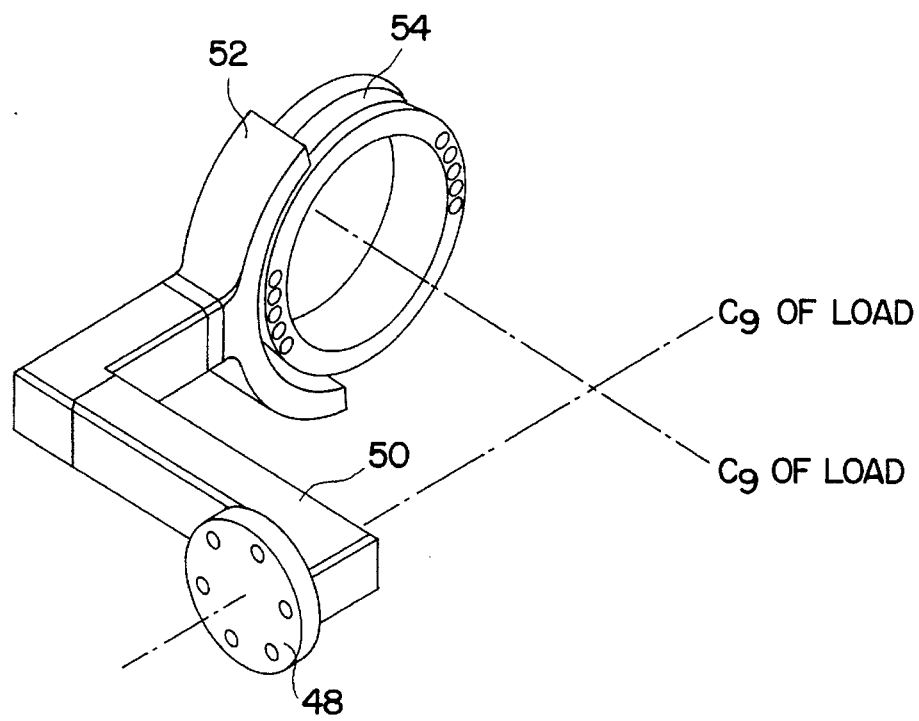
FIG. 6 is a perspective view of the test head adapter ring support structure having an offset holding arm.

The embodiment of the present invention shown in FIG. 1A use spring assembly 106 to balance the load of the test head (and its associated cables). That load may also be balanced, without using a spring assembly, by providing test head adapter ring 54 in an offset position, as shown in FIG. 6. To assure that the center of gravity of the load passes through the center of ring 54 in the x-direction and through the center of flange 48 in the z-direction, beam 50 is formed in a z-shaped configuration.

Usually present as part of the cable pivot of the present invention, is a conventional cable pivot lock knob 189. Such a lock knob is typically placed in cable pivot housing 52 and can engage test head adapter ring 54 to lock ring 54 in position.

Although the invention is illustrated and described herein as embodied in & device testing system, which comprises a support structure, a positioner, a cable pivot housing defining a substantially circular passage completely open on one side, a single piece test head adapter ring, a test head, a test cabinet, a cable, and a cable support, it is nevertheless not intended to be limited to the details shown. Rather, various modifications may be made in the details within the scope and range of equivalents of the claims and without departing from the spirit of the invention.

What is claimed is:

1. A device testing system, including a test head, for evaluating electronic devices comprising:

a movable positioner;

a cable pivot housing including an inside curved surface and a lip on one side of said housing;

means for attaching said cable pivot housing to said positioner, a test head adapter ring including a single piece circular member for rotatably positioning said test head adapter ring while abutting said curved surface and said lip of said cable pivot housing, said test head adapter ring including an opening extending between a) an outside surface along the outer circumference of said test head adapter ring and b) an inside surface along the inner circumference of said test head adapter ring;

first attachment means for attaching said test head adapter ring to said cable pivot housing;

second attachment means for attaching said test head to said test head adapter ring for pivotal movement of said test head.

2. A device testing system as claimed in claim 1 wherein:

(a) a face of said test head adapter ring adjacent said lip on said one side of said cable pivot housing has a guide formed in said face, (b) the outer circumference of said test head adapter ring has a radial groove, (c) a plurality of horizontal cam followers are positioned on said lip of said cable pivot housing for engaging said guide, and (d) a plurality of radial cam followers are positioned on said inside radial surface of said cable pivot housing for engaging said radial groove.

3. A device testing system as claimed in claim 2 wherein said horizontal cam followers are positioned perpendicular to said radial cam followers.

4. A device testing system as claimed in claim 3 wherein there are two horizontal cam followers and three radial cam followers.

5. A device testing system as claimed in claim 1 wherein said second attachment means include:

(a) an inside surface formed on said test head adapter ring, (b) a test head mount affixed to said inside surface of said test head adapter ring, and (c) a rod affixed to said test head on one end and engaging said test head mount.

6. A device testing system as claimed in claim 1 wherein said second attachment means includes a yoke supporting and at least partially enclosing said test head attached directly to said test head adapter ring.

7. A device testing system as claimed in claim 1 wherein said second attachment means includes a projection formed on said test head and connected directly to said test head adapter ring.

8. A device testing system as claimed in claim 1 wherein the outside diameter of said test head adapter ring is smaller than the thickness of said test head.

9. A device testing system as claimed in claim 1 wherein the center of gravity of the cantilever load carried by said test head adapter ring passes through the center of said cable pivot housing.

10. A device testing system according to claim 1, wherein said first attachment means includes a cam follower adapted to be received into said opening and to be attached to said inside curved surface of said cable pivot housing.

11. A device testing system according to claim 1, further comprising a cable connected to said test head and passing through said test head adapter ring.

12. A device testing system according to claim 1, wherein said ring includes a groove on said outside surface and said first attachment means includes a projecting member inserted in the opening and secured to said cable pivot housing and in slidable relation to the groove thereby to secure said ring to said cable pivot housing.

13. A device testing system according to claim 1, wherein said ring includes an additional groove on a side surface of said ring and said first attachment means includes an additional projecting member in slidable relation to the additional groove.

14. A method for attaching a cable pivot housing to a test head adapter ring which is used for supporting a test head, wherein said cable pivot housing includes a) an inside curved surface, b) a lip on one side of said housing, c) a plurality openings formed in said inside curved surface, each for receiving a respective one of a plurality of cam followers, and d) a further plurality of cam followers attached to said lip;

said test head adapter ring includes a) an outside surface along the outer circumference of said test head adapter ring, b) an inside surface along the inner circumference of said test head adapter ring, and c) an opening extending between said inside surface and said outside surface;

said method comprising the steps of:

attaching said test head adapter ring to said further plurality of cam followers attached to said lip;

rotating said test head adapter ring so that said test head adapter ring opening coincides with one of said plurality of openings formed in said inside curved surface;

inserting one of said plurality of cam followers through said test head adapter ring opening;

attaching said one of said plurality of cam followers to said one of said plurality of openings formed in said inside curved surface;

rotating said test head adapter ring so that said opening in said test head adapter ring coincides with another of said plurality of openings formed in said inside curved surface;

inserting another one of said cam followers through said test head adapter ring opening; and attaching said another one of said plurality of cam followers to said another one of said plurality of openings formed in said inside curved surface.

15. A method for attaching a cable pivot housing to a test head adapter ring according to 14, further comprising the step of connecting a cable to said test head by passing said cable through said test head adapter ring.

\* \* \* \* \*

UNITED STATES PATENT AND TRADE MARK OFFICE
CERTIFICATE OF CORRECTION

PATENT NO.   : 5,608,334
DATED        : March 4, 1997
INVENTOR(S)  : Alyn R. Holt It is certified that error appears in the above-identified patent and that said Letters Patent is hereby corrected as shown below:

On the Cover Page, Field [73] "Cheery" should read --Cherry".

At Column 5, line 56, "shape" should read --share--.

At Column 7, line 7, "&" should read --a--.

Signed and Sealed this

Thirtieth Day of September, 1997

*Attest:*

BRUCE LEHMAN

*Attesting Officer*   *Commissioner of Patents and Trademarks*